United States Patent
Seitz et al.

(10) Patent No.: US 7,206,245 B2
(45) Date of Patent: Apr. 17, 2007

(54) METHODS AND APPARATUS FOR IMPLEMENTING STANDBY MODE IN A RANDOM ACCESS MEMORY

(75) Inventors: Helmut Seitz, Essex Junction, VT (US); Manfred Menke, Wolfratshausen (DE)

(73) Assignee: Infineon Technologies AG, Munich (DE)

( * ) Notice: Subject to any disclaimer, the term of this patent is extended or adjusted under 35 U.S.C. 154(b) by 40 days.

(21) Appl. No.: 11/116,456

(22) Filed: Apr. 28, 2005

(65) Prior Publication Data

US 2006/0245287 A1 Nov. 2, 2006

(51) Int. Cl.
*G11C 7/00* (2006.01)

(52) U.S. Cl. .................. 365/222; 365/194; 365/229
(58) Field of Classification Search ............ 365/194, 365/222, 229; 713/320, 323
See application file for complete search history.

(56) References Cited

U.S. PATENT DOCUMENTS

| | | | |
|---|---|---|---|
| 5,423,045 A * | 6/1995 | Kannan et al. ............. | 713/322 |
| 6,313,695 B1 * | 11/2001 | Ooishi et al. ............... | 327/544 |
| 2004/0073824 A1 * | 4/2004 | Machida ...................... | 713/323 |
| 2005/0223245 A1 * | 10/2005 | Green et al. ................. | 713/300 |

* cited by examiner

Primary Examiner—Hoai V. Ho
(74) Attorney, Agent, or Firm—Edell, Shapiro & Finnan, LLC

(57) ABSTRACT

A memory device includes: a generator system having a number of generators that supply voltage or current to the memory device, a controller that supplies to the generator system a state control signal that commands the generators to be in an active state or a standby state, and a self-refresh oscillator that generates a self-refresh clock signal having a period suitable to refresh memory cells of the memory device. The controller uses the self-refresh clock signal to delay transitions of the state control signal from the active state to the standby state relative to corresponding state changes of at least one external signal received by the memory device.

25 Claims, 6 Drawing Sheets

METHODS AND APPARATUS FOR IMPLEMENTING STANDBY MODE IN A RANDOM ACCESS MEMORY

BACKGROUND OF THE INVENTION

1. Field of the Invention

The present invention relates to methods and apparatus for implementing a standby mode in a random access memory and, more particularly, to techniques for controlling the standby mode in the generator system of a random access memory using an existing self-refresh oscillator to ensure the generator system experiences sufficiently long active states to maintain internal functions.

2. Description of the Related Art

In electronic memory devices, such as dynamic random access memories (DRAMs), it is often desirable to conserve power. For example, conventional DRAM chips are capable of entering a power down state or a standby state when commanded by an external signal or via on-chip control signals. During a standby state, the chip conserves power by temporarily reducing the amount of power consumed by certain components on the chip. To ensure proper chip operation, the chip maintains necessary circuits in an active state, such as the receivers, which are responsible for receiving external signals, and the self-refresh block, which is responsible for periodically refreshing the charge levels in the memory array. Other circuits, such as the generator system, may have their power reduced or removed during standby mode.

The generator system of a DRAM chip is essentially the portion of chip responsible for receiving an external power supply ($V_{DD}$) and generating all internal voltages and currents required by the chip to operate. The internal voltages include internal supply voltages, which are typically applied to some type of load within the chip (e.g., the memory array), and internal reference voltages, which are used by on-chip comparators to determine whether certain voltage levels on the chip are above or below pre-determined target levels. The generator system may supply internal currents for the refresh clock, charging capacitances, etc. Typically, the generator system includes a number of individual generators respectively associated with specific supply voltages, reference voltages, or supply currents. More specifically, the generator system includes a voltage reference system as well as active generators such as voltage pumps and voltage regulators.

In a fully active state, a DRAM generator system consumes significant power. Consequently, it is desirable to switch the generator system to a lower power state or standby mode when possible. Some generators, for example, use a differential amplifier with less bias current or a resistor divider with higher resistors, thereby requiring less current. Other generators operate at half power compared to active operation thus facilitating lower current consumption.

If a DRAM chip is in a standby mode when an external command, such as a read or write command, is received, the chip must immediately transition to an active mode to respond to the command. External commands detected by the chip's receiver are supplied to a command decoder that translates external commands into corresponding internal command signals. A global controller responds to the internal command signals by generating a corresponding set of output signals, which are routed to the various portions of the DRAM chip to carry out the requested operation. In particular, the global controller generates an internal signal (BNKIDLE) that indicates to the generator system whether the chip is in an active or standby state (e.g., BNKIDLE high=standby state; BNKIDLE low=active state). Upon receipt of an external command, the global controller immediately sets the BNKIDLE signal to the active state, thereby causing the generator system to supply all necessary voltages and currents to the DRAM chip.

Even in a standby state, the generator systems of typical commodity DRAMs still consume considerable current, for example, by continuously supplying reference voltages to comparators to determine if operational voltages are at target levels. For low-power, specialized DRAMs such as those used in mobile applications (e.g., cellular RAMs), the specifications for current usage in standby mode are even more stringent than in commodity DRAMs. To meet the standby requirements of such devices, a clocked standby mode can be employed. In a clocked standby mode, when the DRAM chip experiences an extended standby state, the generator system periodically alternates between an active or "enabled" standby state and an off or "disabled" standby state, such that the generator system is activated only for short periods of time while the chip is in a standby state, e.g., less than 10% of the time. During a continuous period of time in which no external command is received, the generator may periodically enter the enabled standby state for an operational period of time ($t_{oper}$) followed by a disabled standby state for a disabled period of time ($t_{disable}$) (this periodic cycle is interrupted when an external command is received). For example, operational time $t_{oper}$ may be a few microseconds long and constitute roughly a tenth of the overall cycle time ($t_{cycle}=t_{oper}+t_{disable}$) of the clocked standby mode. During the disabled standby state of the clocked standby mode, the whole generator system is disabled with the exception of a few circuits, such as VDD and PWRON-detection. Thus, the generator system is inactive about 90% of the time, facilitating markedly reduced power consumption in a clocked standby state as compared to conventional approaches.

Within the periodic enabled standby state, the activated generator system is able to restore voltage and current levels to compensate for any voltage drops that may have resulted from leakage or refresh operations during the disabled period. Reference voltage generators typically require a few microseconds to establish a stable, target voltage level. The active state of the clocked standby state can be correlated to the refresh related loads required by the memory device so that any voltage ripple will be well controlled.

The internal signal, BNKIDLE, can be used to facilitate the functioning of the above-described clocked standby mode. For example, every rising edge of the BNKIDLE signal can be used to set the generator system in the disabled phase of the clocked standby mode for the period $t_{disable}$. With every falling edge of BNKIDLE, the generator system enters the briefer enabled period $t_{oper}$.

Depending upon the system configuration, external commands sent to a DRAM chip can be very brief pulses. If purely following an external command, the BNKIDLE signal can be low (indicating an active state) less than 20 nanoseconds (ns). The generator system is typically designed to react quickly to transitions of BNKIDLE from a standby state to an active state (e.g., transitions from a high to low state) to rapidly begin supplying and establishing necessary voltages and currents at defined, stable levels. Nevertheless, such short active state durations may not be sufficient to permit certain generators to fully respond to the active state. For example, generators responsible for establishing reference voltages typically require significantly longer active periods to supply an accurate, stable voltage to a comparator (e.g., on the order of a few microseconds). To compensate, certain individual generators within the generator system may internally delay the transition back to standby mode to provide additional time to react to an active state command. Even these measures, however, may be insufficient to assure that the active generators are able to react to any voltage drop (or current draw) occurring during a very short (pulsed) active state period or during a subsequent standby state, particularly when large variations in duration of the states occur.

One solution to address brief active states is to individually delay the rising edge of BNKIDLE within certain generators of the generator system, for example, by durations between 80 and 500 ns. This approach, which has been implemented with active generators such as voltage regulators and voltage pumps, does not cause a delay centrally within the generator block but individually for the active generators. With such local delays, a minimum active phase of each active generator is set independent of the pattern of the BNKIDLE signal. In this manner, un-stabilized voltages within resistor divider and differential amplifier circuits can generally be avoided. Signal patterns with short BNKIDLE low phases can be handled, because a minimum active time of the active generators such as voltage regulators and voltage pumps guarantees that the charge will be recovered on the decoupling capacitances at the internal voltages.

Generators in the generator system responsible for producing reference voltages typically have been treated differently. Generally, the reference voltage system is always active and therefore independent of BNKIDLE. In some cases, the reference voltage system always remains active but is capable of switching between different power supply currents depending upon the state of BNKIDLE. Nevertheless, a memory device employing all generators together will experience a variety of slightly different delays, such that a phase exists where one generator is still in an active state while another generator is in a standby state.

From a system overview standpoint, the foregoing approach makes it is difficult to keep track of which of the generators within the generator system is delaying the rising edge of BNKIDLE and by what duration. This approach also makes the system design more complex and prone to design errors and oversights. For example, there is a risk during design of a specific circuit within the generator system that the wrong edge will be delayed (falling edge of BNKIDLE instead of the rising edge). Moreover, the delay itself may vary among the generators, due primarily to reuse reasons. Another shortcoming of designing generators with built-in delay mechanisms for delaying the transition to standby mode is that such delays are typically implemented using resistor-capacitor (RC) circuits, which take up considerable space on the chip.

Further, the solution of delaying the rising edge of BNKIDLE for 80 to 500 ns in certain active generators may not prevent failure of the generator system of a DRAM chip under certain signal patterns and, in particular, a generator system using the clocked standby mode may be particularly susceptible to losing margin and failing under certain signal patterns. Specifically, a series of very brief (e.g., tens of nanoseconds) active states spaced apart by standby periods on the order of hundreds of nanoseconds may cause reference voltage levels (which may require several microseconds to stabilize) to gradually degrade from target levels.

SUMMARY OF THE INVENTION

According to one aspect of the invention, a memory device includes: a generator system having a plurality of generators that supply voltage or current to the memory device, a controller that supplies to the generator system a state control signal that commands the generators to be in an active state or a standby state, and a self-refresh oscillator that generates a self-refresh clock signal having a period suitable to refresh memory cells of the memory device. The controller uses the self-refresh clock signal to delay transitions of the state control signal from the active state to the standby state relative to corresponding state changes of at least one external signal received by the memory device. For example, the transitions of the state control signal from the active state to the standby state are delayed by at least one-half of a period of the self-refresh clock signal (e.g., on the order of at least one microsecond). In contrast, the state control signal transitions from the standby state to the active state substantially simultaneously with corresponding state changes of the external signal. The state control signal can control all or just a subset of the generators in the generator system.

According to another aspect of the invention, there is provided a method of controlling a state of a generator system in a memory device. The method includes receiving at least one external signal whose state is used by the memory device to control whether the generator system is in an active state or a passive state; and generating a state control signal that commands the generators of the generator system to be in an active state or a standby state in response to the external command, wherein a self-refresh clock of the memory device is used to delay an onset of the standby state of the state control signal relative to a corresponding state change of at least one external signal.

According to a particular implementation, a first signal transitions from a first state to a second state in response to a corresponding state change of the external signal. After transition of the first signal, a second signal transitions from a first state to a second state in response to a rising edge of a self-refresh clock signal (or, alternatively, a falling edge). After the transition of the second signal, the state control signal transitions from the active state to the standby state in response to the falling edge of the self-refresh clock signal (or, alternatively, the rising edge) such that onset of the standby state of the generators is delayed relative to the corresponding state change of the external signal by at least one half of the period of the self-refresh clock signal.

The above and still further aspects, features and advantages of the present invention will become apparent upon consideration of the following definitions, descriptions and descriptive figures of specific embodiments thereof wherein like reference numerals in the various figures are utilized to designate like components. While these descriptions go into specific details of the invention, it should be understood that variations may and do exist and would be apparent to those skilled in the art based on the descriptions herein.

DESCRIPTION OF THE PREFERRED EMBODIMENTS

Figure 1:
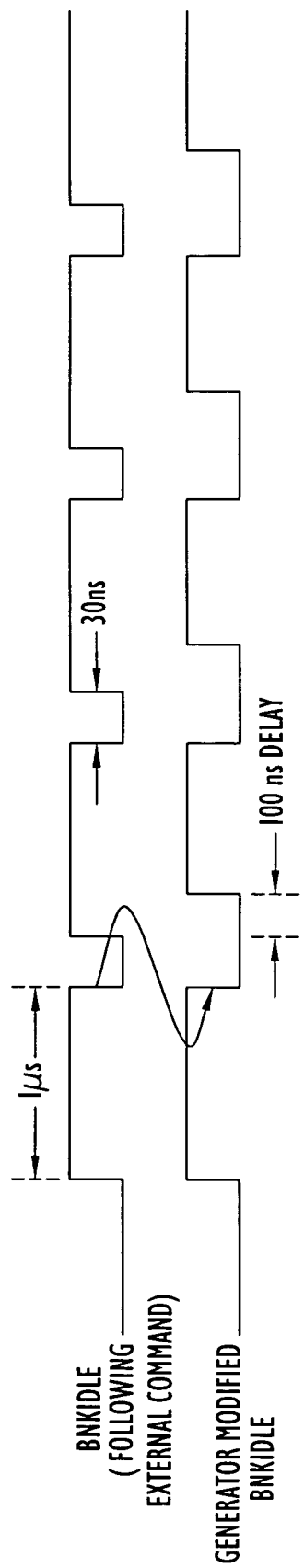
FIG. 1 is a timing diagram illustrating a scenario in which rapid toggling between the active and standby states results in a failure of a reference voltage generator of a random access memory device.

To better illustrate the invention, a signal pattern that could potentially cause one or more generators of a DRAM generator system to fail will be described in connection with FIGS. 1 and 2. FIG. 1 is a timing diagram illustrating the state of the BNKIDLE signal that controls the active/standby state of a generator system of a random access memory during a usage condition in which repeated, short active states are commanded. The BNKIDLE signal shown in the top line of FIG. 1 essentially follows the state of the external command signal, which repeatedly alternates between a 1 μs standby state and a 30 ns active state. The bottom line in FIG. 1 shows a BNKIDLE signal that has been internally modified by an individual generator (e.g., a generator that produces a reference voltage) to delay the rising edge of the BNKIDLE signal (and hence the onset of the standby state) using an RC delay of 100 ns to provide additional time to establish a stable target voltage level.

Note that the generator system in this case may be employing the above-described clocked standby mode when not receiving an external signal. However, the period of the signal pattern and the duration of the active states shown in FIG. 1 are much shorter than those of the clocked standby mode. These external signals essentially interrupt the clocked standby mode and prevent the clocked standby cycle from completing. The chip may not see a complete clocked standby cycle if the falling edge of BNKIDLE occurs before the first cycle of the clocked standby mode is finished.

This scenario would result in an insufficient continuous active phase for the whole generator system, including reference generators which need on the order of 1 to 2 μs to stabilize internal voltages. Even with the duration of each BNKIDLE active state being extended by 100 ns by the reference generator (bottom of FIG. 1), BNKIDLE low (active) state is too short to permit the reference generator to re-establish target voltage levels, resulting in a gradual voltage degradation over time and ultimately failure of the chip.

Note that if the signal pattern is such that external commands are more spaced apart to permit full cycles of the clocked standby mode, the periodic active states are generally sufficient to maintain voltage levels in the generator system. Likewise, very closely spaced or overlapping commands (or longer command signal pulses) result in longer continuous active states and avoid generator failures of the type induced by the signal pattern shown in FIG. 1.

Figure 2:
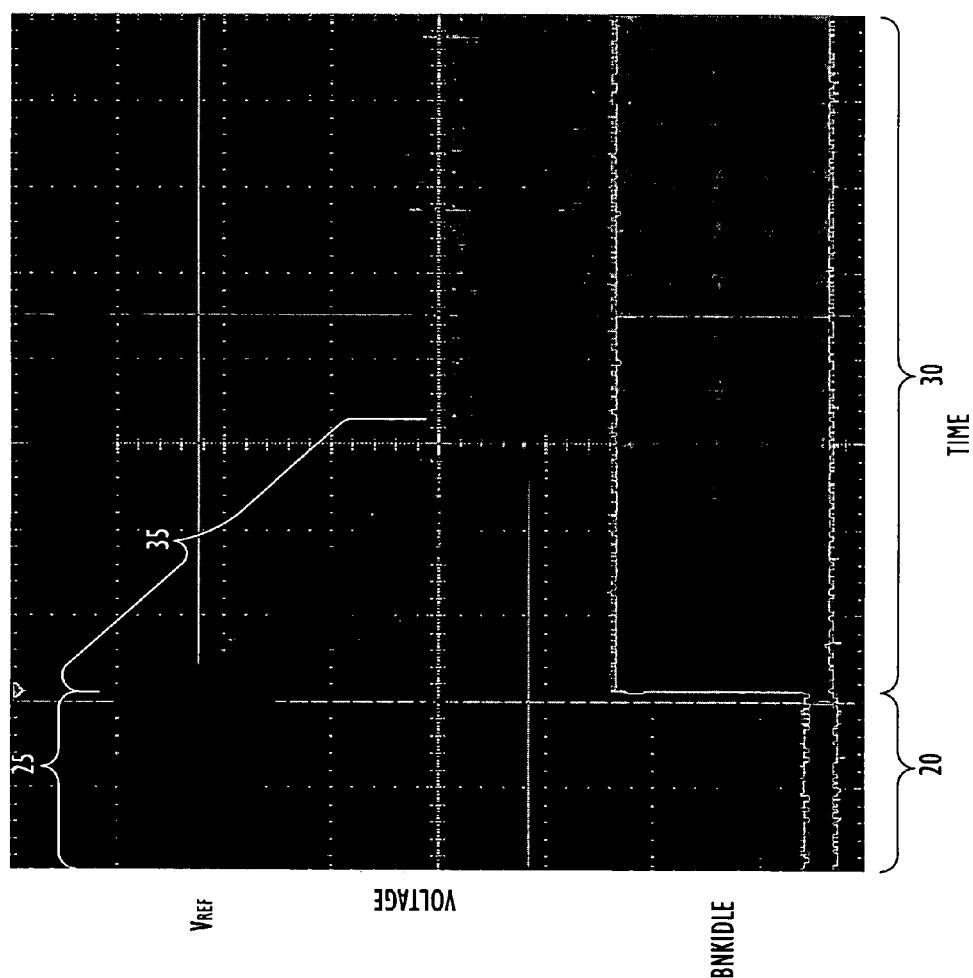
FIG. 2 is a graph illustrating a rapid toggling of the BNKIDLE signal resulting in very short active states and the corresponding level of a reference voltage $V_{REF}$ as the reference voltage generator fails.

FIG. 2 graphically illustrates the observed behavior of a reference voltage $V_{REF}$ produced by a reference voltage generator subjected to a rapidly toggling BNKIDLE signal with short active phases, such as that shown in FIG. 1. The lower signal shown in FIG. 2 is the BNKIDLE signal, which, after an initial period 20 in an active (low) state, is rapidly toggled between 75 ns active (low) states and 400 ns standby (high) states (period 30 in FIG. 2). In FIG. 2, during the toggling period, the plot of the BNKIDLE signal appears as a rectangular box with light gray horizontal bands across the top and bottom. This is actually a depiction of the BNKIDLE signal very rapidly transitioning between the high (standby) and low (active) state, but is very compressed in FIG. 2 due to the time scale used.

The upper signal shown in FIG. 2 represents the internal reference voltage $V_{REF}$ maintained by the generator. Note that while the $V_{REF}$ and BNKIDLE signals are depicted on the same graph in FIG. 2 to show correspondence in time, the two signals are shown with separate voltage scales (the placement of the $V_{REF}$ plot above the BNKIDLE plot is arbitrary). During the initial active period 20 of BNKIDLE, the value of $V_{REF}$ remains stable, near a target voltage level, as indicated by segment 25 in FIG. 2. However, with the onset of the rapid toggling of BNKIDLE, $V_{REF}$ begins to drift down to a lower voltage level over period 35, resulting in failure of the generator. Specifically, as the BNKIDLE signal toggles between the active state and the stand-by state, the generator is unable to maintain the appropriate voltage levels, because the generator is not continuously in an active state for a long enough duration to maintain the internal reference voltage level. Therefore, the voltage level, as depicted in section 35, slowly drifts down to unacceptable levels, eventually placing the memory device in failure.

FIG. 2 essentially depicts a situation in which the comparators employed by the memory device do not have a sufficient time duration due to the short active phases of the memory device in which to complete the internal voltage check, as described above. This steady decrease in the reference voltage is a result of the short active state of the external command, as depicted in FIG. 1.

According to the present invention, a random access memory device is configured to prevent failure of the generator system under any external command signal pattern by globally delaying the rising edge of the BNKIDLE signal supplied to the generator system, so that all of the generators remain in an active state for at least the duration of the delay period. Specifically, switching between active and standby generation operation is still essentially controlled by external commands (e.g., read or write access requests). However, the present invention employs a novel technique that guarantees a minimum reaction time for the generators so that internal voltages remain stable with negligible voltage ripple independent of the pattern of external access frequencies or duty cycles from active to standby operation or vice versa.

This guaranteed behavior is realized by delaying the rising edge of the BNKIDLE signal seen by the generator system, which indicates a change from an active state to a standby state for the generator system as a whole. The "raw" BNKIDLE signal, whose state corresponds to the pattern of external signals received by the memory device, can be modified by the circuitry that uses an internally available self-refresh oscillator to apply a suitably long delay of several microseconds to each rising edge of the BNKIDLE signal without changing the timing of falling edges of the BNKIDLE signal. The period of the self refresh oscillator is relatively slow, on the order of at least a microsecond and preferably several or tens of microseconds, making it ideal for applying delays to the BNKIDLE signal using straightforward circuitry. With this implementation, the memory device generators (in particular, reference voltage generators) do not fail when subjected to a pattern of a rapidly alternating active and standby states with a low active duty cycle (e.g., standby periods between 500 ns up to several microseconds interrupted by shorter active states).

Figure 3:
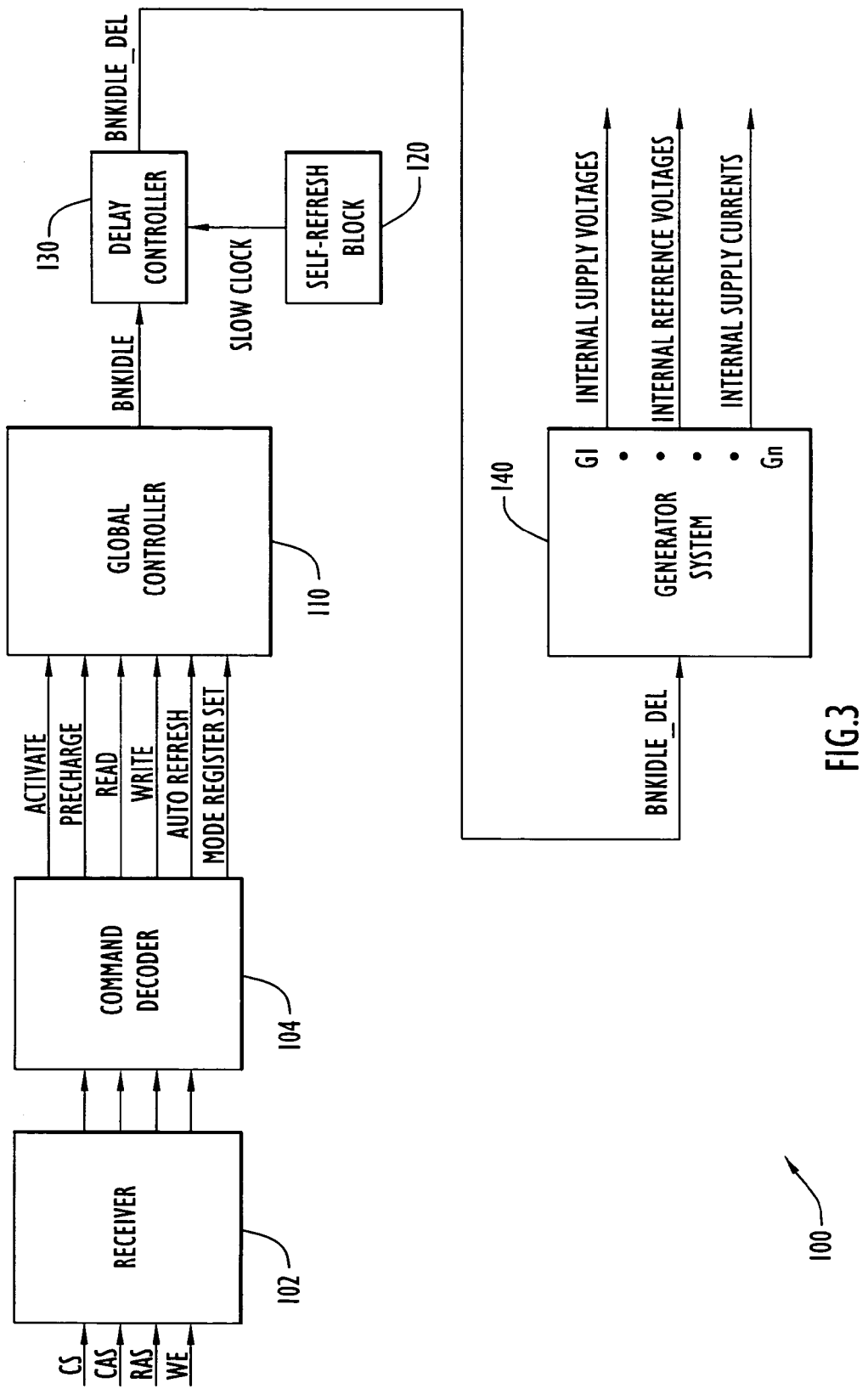
FIG. 3 is a block diagram depicting a memory device configured in accordance with an exemplary embodiment of the present invention to ensure sufficiently long active states in the generator system of a random access memory device.

A block diagram of a random access memory device 100 according to an exemplary embodiment of the present invention is shown in FIG. 3. A receiver 102 receives external command signals (e.g., chip select (CS), column address strobe (CAS), row address strobe (RAS), and write enable (WE)) and supplies the signal to a command decoder 104 responsible for decoding the external command signals into internally usable commands (e.g., activate, precharge, read, write, auto refresh, mode register set, etc.). A global controller 110 responsible for controlling the overall operation of the memory device, responds to the internal commands by generating the various internal signals required throughout the chip to carry out the operations commanded by the external signals. Among those signals is the BNKIDLE signal, which is indicative of whether the memory device is in an active or standby state (for simplicity, other signals generated by the global controller are not shown in FIG. 3). In the embodiment shown in FIG. 3, the BNKIDLE signal is modified by a delay controller 130 to produce a BNKIDLE_DEL (BNKIDLE delay) signal that is supplied to a generator system 140, which includes a plurality of generators $G_1 \ldots G_n$ responsible for producing internal supply voltages and currents and internal reference voltages. While the terms BNKIDLE and BNKIDLE_DEL are used herein in the description of the exemplary embodiment, it will be understood that the present invention is not limited to signals having these designations, and, more generally, the invention encompasses any internal state control signal that controls the active/standby state of a generator system or portions thereof in the manner described.

Delay controller 130 employs a self-refresh clock signal supplied by a self-refresh block 120 to generate the BNKIDLE_DEL signal from the BNKIDLE signal. The self-refresh block is primarily responsible for periodically refreshing the charge levels of the cells in the memory array and includes a self-refresh oscillator that produces a self-refresh clock signal. The self-refresh clock signal has a period corresponding to the rate at which the cells in the memory array are refreshed, making this clock signal a "slow clock" relative to operating clock supplied to the memory device (CLK) and relative to the potential rate and duration of external signals and the active/standby duty cycle. The period of the self-refresh clock supplied to the delay controller is on the order of at least one microsecond and preferably at least several microseconds, making it useful for imparting delays that will ensure sufficiently long active states in the generator system (e.g., delays of at least one microsecond). Self-refresh oscillators operating with shorter periods may be used, provided the delay time generated using the self-refresh clock signal results in sufficiently long active states for the generators to operate properly. Advantageously, a self-refresh clock with a suitable period is available on virtually any DRAM or other memory device requiring periodic refresh of memory cells (e.g., pseudo-SRAMs), and use of an existing clock avoids using other delay mechanisms that would otherwise require additional space on the memory device, such as large RC delay elements.

The BNKIDLE_DEL signal is used to control the active/standby state of the generators, such that the onset of the standby state (rising edge of the BNKIDLE_DEL signal) is delayed relative to the onset of the BNKIDLE signal. However, the falling edges of the BNKIDLE_DEL delay signal are substantially synchronous with those of the BNKIDLE signal, such that the generators of generator system 140 enter the active state with substantially no delay (other than signal propagation delays). While shown as a separate module in FIG. 3 for emphasis, in general, the circuitry and operations of the delay controller can be incorporated into the global controller or implemented with a separate circuit as shown, and the invention is not limited to any particular architecture for implementing the delay controller. The BNKIDLE_DEL signal can be used by the generator system to control all of the generators within the generator system, which has the advantage of a simple design that is no prone to errors in implementation. Alternatively, the generator system can use the BNKIDLE_DEL signal to control a subset of the generators within the generator system (e.g., just the reference voltages generators).

Figure 4:
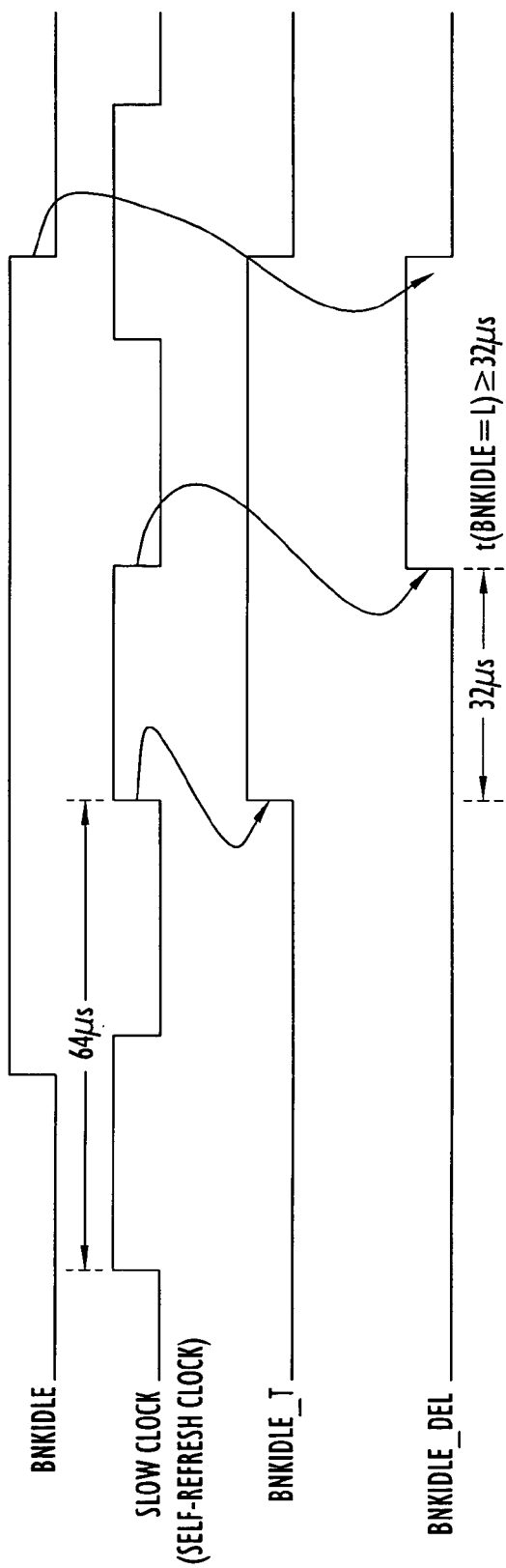
FIG. 4 is a timing diagram illustrating a scheme by which an existing self-refresh clock is employed by a delay controller to apply a sufficient delay in the onset of standby mode in the generator system.

FIG. 4 is a timing diagram illustrating one implementation of how the delay controller can employ a slow clock, such as a self-refresh clock, to produce a modified BNKIDLE signal having sufficiently long active periods. The unmodified BNKIDLE signal shown in FIG. 4 is initially in the low (active) state, transitions to a high (standby) state, and then transitions back to a low state. In the example shown in FIG. 4, the self-refresh clock has a period of 64 μs with a 50% duty cycle (i.e., each full clock cycle includes a 32 μs active phase and a 32 μs standby phase. Again, the invention is not limited to any particular clock period for the self-refresh clock signal, so long as the period is sufficient long to ensure an adequate delay in the rising edge of the modified BNKIDLE signal to allow recovery in the generators (typically, the delay would be on the order of at least one microsecond, and the period would be at least a few microseconds long).

The delay controller uses the self-refresh clock in the following manner to ensure a delay of at least half of the period of the self-refresh clock cycle. The delay controller maintains an internal signal BNKIDLE_T that essentially follows the BNKIDLE signal with the exception that the transition from the low state to the high state of the BNKIDLE_T signal is delayed relative to the BNKIDLE signal. Specifically, the BNKIDLE_T signal transitions from the low state to the high state at the time of the first rising edge of the self-refresh clock signal after the transition of the BNKIDLE signal from the low state to the high state. Note that the slow self-refresh clock signal is not synchronized with the timing of the BNKIDLE signal. Consequently, the timing difference between the rising edge of the BNKIDLE signal and the next rising edge of the self-refresh clock can be between 0 and 64 μs (i.e., up to one full self-refresh clock period).

The BNKIDLE_T signal is essentially an intermediate signal that is used within the delay controller in conjunction with the self-refresh clock to generate the BNKIDLE_DEL signal (depending on the phase of the self-refresh clock, the delay of the rising edge of the BNKIDLE_T signal itself is not necessarily sufficient to provide the one or more microsecond delay required to ensure proper operation). Specifically, as shown in FIG. 4, the BNKIDLE_DEL signal transitions from the low (active) state to the high (standby) state at the time of the first falling edge of the self-refresh clock after the BNKIDLE_T signal has transitioned to the high state. In other words, the BNKIDLE_T transitions to a high state at a rising edge of the self-refresh clock, and the BNKIDLE_DEL transitions to a high state at the next falling edge of the self-refresh clock, thereby ensuring a delay of at least one half of the self-refresh clock period (in this case, 32 μs) between the rising edge of the unmodified BNKIDLE signal and the rising edge of the BNKIDLE_DEL signal. Note that this delay can vary between 0.5 and 1.5 self-refresh clock periods, depending on the phase of the self-refresh clock signal relative to the rising edge of the BNKIDLE signal. In the example shown in FIG. 4, the minimum possible delay is about 32 μs and the maximum possible delay is about 96 μs.

Since the BNKIDLE_DEL signal controls the active/standby state of all the generators in the generator system, delaying the rising edge of the BNKIDLE_DEL signal by at least one half of the self-refresh clock period ensures that the minimum duration of the active states of the generators will be at least one half of the self-refresh clock period regardless of the duration of the active state of the external command and the BNKIDLE signal. Consequently, it is unnecessary to implement internal RC delays in individual generators, although any such delay mechanisms would merely supplement the delay provided by the BNKIDLE_DEL signal.

Importantly, the BNKIDLE_DEL signal is not simply a delayed version of BNKIDLE resulting in a signal shifted in time. Only the rising edge of the BNKIDLE_DEL signal is delayed relative to the unmodified BNKIDLE signal. The BNKIDLE_T and BNKIDLE_DEL signals transition from the high standby state to the low active state substantially simultaneously with the unmodified BNKIDLE signal. In other words, there is virtually no delay between the falling edge of the BNKIDLE signal and the falling edge of the BNKIDLE_DEL signal other than the very brief time required for the signals to propagate through the logic of the delay controller. This scheme ensures that the BNKIDLE_DEL signal supplied to the generator system will activate the generators of the generator system with minimal delay upon receipt of an external command.

Figure 5:
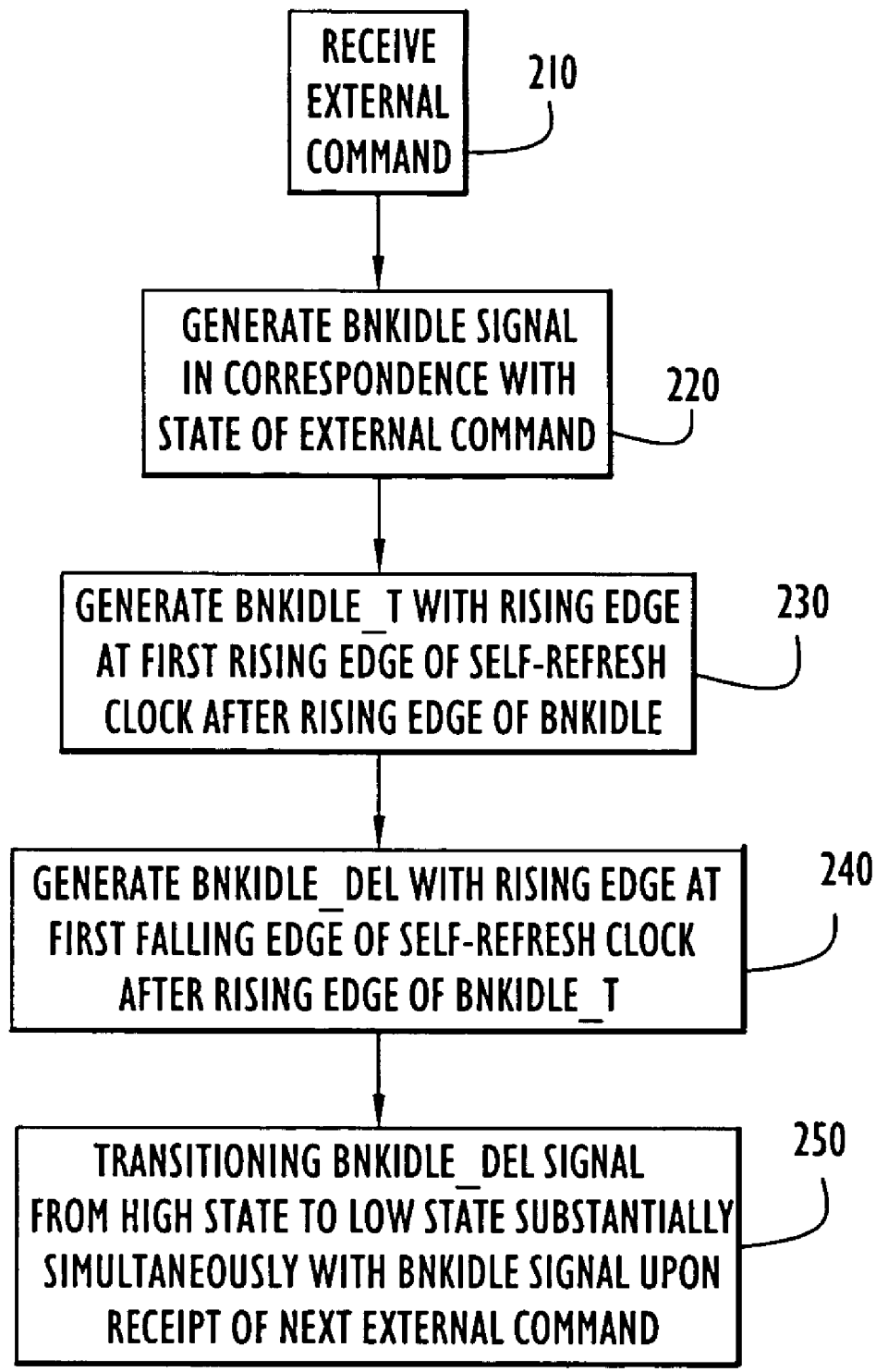
FIG. 5 is a functional flow diagram illustrating the operations performed according to an exemplary embodiment of the present invention to ensure sufficiently long active states in the generator system of a random access memory device.

The flow diagram shown in FIG. 5 summarizes the operations for generating the BNKIDLE_DEL signal upon receipt of external commands using the exemplary memory device shown in FIG. 3. In operation 210, an external command is received by the receiver 102, causing the command decoder 104 to send internal command signals to the global controller 110. In response to the internal command signals, global controller 110 sends the BNKIDLE signal to the active state in correspondence with the duration of the external signals (operation 220). At the end of the external command, global controller 110 sends the BNKIDLE signal from a low (active) state to a high (standby) state.

The delay controller 130 receives the BNKIDLE signal and the self-refresh clock signal. In response to a rising edge of the BNKIDLE signal, in operation 230, the delay controller 130 causes the BNKIDLE_T signal to transition from the low state to the high state (rising edge) at the first rising edge of the self-refresh clock after the rising edge of the BNKIDLE signal. In operation 240, at the first falling edge of the self-refresh clock after the rising edge of the BNKIDLE_T signal, the BNKIDLE_DEL signal transitions from the low state to the high state, thereby ensuring a delay of the rising edge of the BNKIDLE_DEL signal of at least one half of the self-refresh clock period relative to the BNKIDLE signal. Upon receipt of the next external command, BNKIDLE_DEL transitions from the high (standby) state to the low (active) state substantially simultaneously with the BNKIDLE signal.

Figure 6:
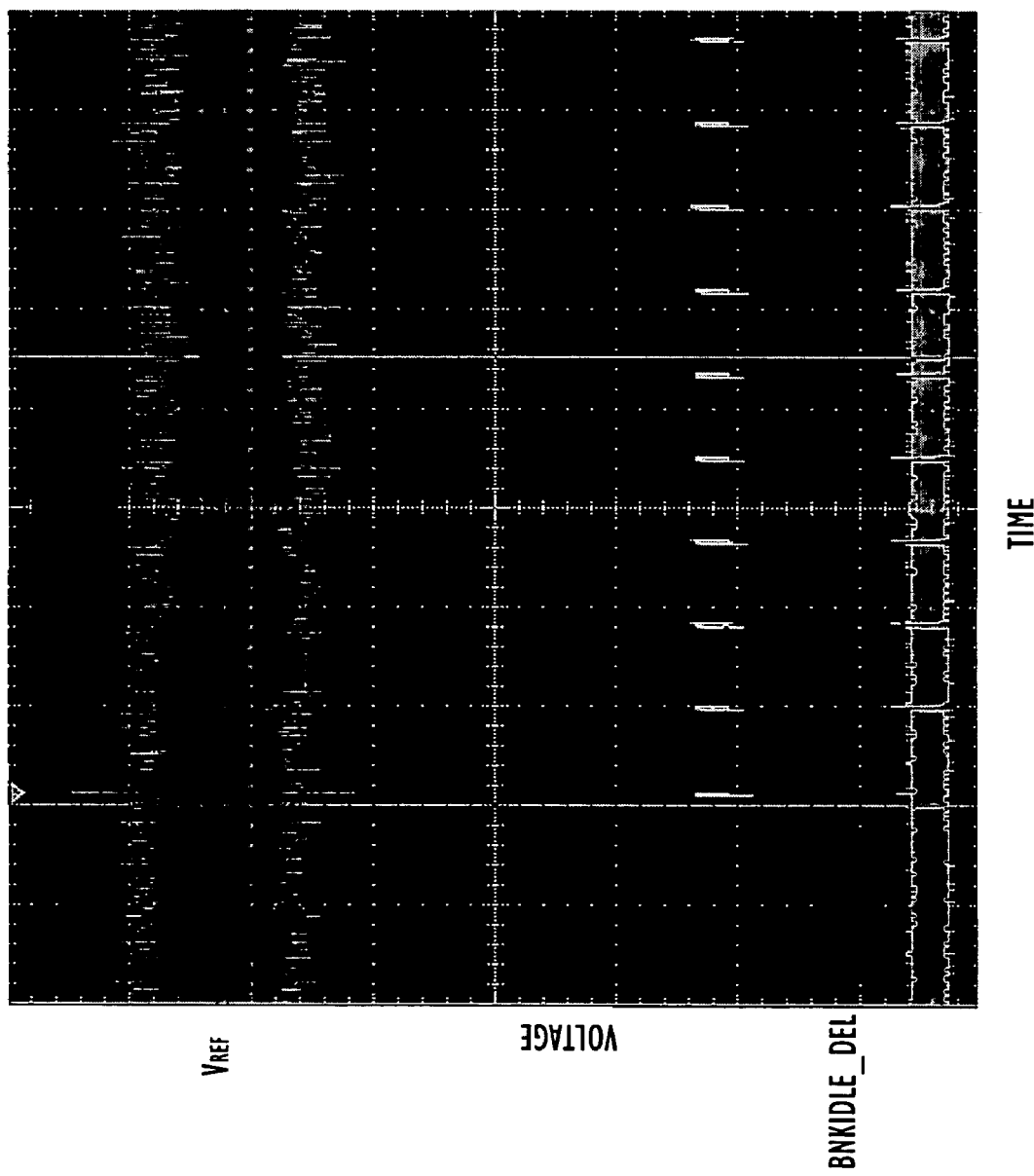
FIG. 6 is a graph illustrating normal operation of a reference voltage generator generating a voltage $V_{REF}$ despite rapid toggling of the active and standby states by external signals.

FIG. 6 is a graph illustrating the observed behavior of a reference voltage $V_{REF}$ produced by a reference voltage generator receiving a signal pattern modified by the delay scheme of the present invention. The lower signal shown in FIG. 6 is the BNKIDLE_DEL signal which repeatedly alternates between the active (low) and standby (high) state. As in the graph of FIG. 2, the standby periods are 400 ns in duration. However, in this example, the active states are force by the delay controller to last 8 μs, such that the reference voltage generator can fully establish a stable target voltage for $V_{REF}$ (shown as the upper signal in FIG. 6) during each active period. Consequently, the voltage level of $V_{REF}$ is maintained at the target level and does not degrade over time.

The invention provides a number of advantages over conventional approaches. Instead of employing several local delays within individual generators of the generator system, where these delays may differ or even may be unintentionally omitted, the same, single delay is applied to the rising edge of the BNKIDLE that is supplied to the whole generator system (BNKIDLE_DEL). Moreover, delays on the order of 500 ns are maximum achievable with RC delays in the individual generators, which may be insufficient to prevent failure of the memory device. In contrast, the technique of the present invention ensures delays in transitioning to the standby state on the order of a microsecond or several microseconds (e.g., in the example above, at least 32 μs). This delay is applied globally to the generator system and is independent of local existing delays (which would produce a generator-specific delay in addition to the global delay). The RC delay elements previously used in the individual generators to produce short delays can be completely eliminated, which can save thousands of square microns on the memory device.

By using the self-refresh clock that is already available on the memory device, the invention implements a delay of several microseconds without requiring an additional clock that would take up valuable area on the memory device. Further, this approach is far superior to using RC delays, which would require substantial chip area to produce delays on the order of several microseconds.

Moreover, the present invention simplifies the generator design and avoids potential design errors. Every generator depending on BNKIDLE receives the same delay for switching from active to standby operation, thereby eliminating the need to design delay schemes for individual generators. Design mistakes such as omitting delays or erroneously triggering delays on the wrong edge of a signal are prevented, and only one signal needs to be tested during development to verify the BNKIDLE delay rather than multiple signals (which is particularly desirable, since design testing of the generator system tends to focus on driver strength, current consumption, and stability of analogue circuits rather than on logical verification).

The invention guarantees a minimum active phase of the generators for fast recover of any kind of charge loss on the internal voltage decoupling capacitances, and no "intermediate" frequency pattern of external signals switching on and off (e.g., the sort shown in FIG. 1) can trigger higher voltage ripples or failure of the memory device. Sufficient time is always provided for the voltage generator system to return to desired voltage levels after a peak load, even when the standby operation is interrupted at any arbitrary time. Moreover, the scheme of the present invention does not delay the onset of an active state, and the generator system immediately enters an active state in response to an external command requiring active operation. The present invention is fully compatible with any standard generator system as well as generator systems that employ a clocked standby mode.

The present invention essentially extends the duration of the active state in the whole generator system by delaying the onset of each standby state. The current increase resulting from this extension of the active state in the generator system is negligible. For example, there is no current increase for active pattern (IDD0,IDD1, . . . ). For a standby pattern, a higher current occurs only at the very beginning (switching to BNKIDLE=H); however, by averaging over several milliseconds, this increase vanishes.

While use of the self-refresh clock is particularly advantageous for the reasons described above, it will be appreciated that the invention could be carried out with any "slow clock" that provides a delay of at least about one microsecond and preferably at least a few microseconds.

While the invention has been described with certain signal polarities (e.g., "high" and "low" states) that are conventionally used, it will be appreciated that the invention is not limited to the use of signals of any particular polarity or any particular correspondence between states of certain signal and certain functions. For example, while the standby state has been associated with a "high" state and the active state has been associated with a "low" state, the invention would operate equally well with an opposite polarity convention. Likewise, certain signals described as being triggered on rising edges of clock signals could be triggered on falling edges and vice versa, so long as the overall signal delay scheme is performed.

Having described preferred embodiments of new and improved methods and apparatus for implementing a standby mode in a random access memory, it is believed that other modifications, variations and changes will be suggested to those skilled in the art in view of the teachings set forth herein. It is therefore to be understood that all such variations, modifications and changes are believed to fall within the scope of the present invention as defined by the appended claims. Although specific terms are employed herein, they are used in a generic and descriptive sense only and not for purposes of limitation.

What is claimed is:

1. A memory device, comprising:
   a generator system comprising a plurality of generators configured to supply voltage or current to the memory device;
   a controller configured to supply a state control signal to the generator system, the state control signal commanding the generators to be in an active state or a standby state; and
   a self-refresh oscillator configured to generate a self-refresh clock signal having a period suitable to refresh memory cells of the memory device, wherein the controller uses the self-refresh clock signal to delay transitions of the state control signal from the active state to the standby state relative to corresponding state changes of at least one external signal received by the memory device.

2. The memory device of claim 1, wherein the generators commanded by the state control signal are all of the generators in the generator system.

3. The memory device of claim 1, wherein the generators commanded by the state control signal are a subset of the generators in the generator system.

4. The memory device of claim 1, wherein the state control signal transitions from the standby state to the active state substantially simultaneously with corresponding state changes of the at least one external signal.

5. The memory device of claim 1, wherein transitions of the state control signal from the active state to the standby state are delayed by at least one-half of a period of the self-refresh clock signal.

6. The memory device of claim 1, wherein transitions of the state control signal from the active state to the standby state are delayed by at least one microsecond.

7. A memory device, comprising:
   a generator system comprising a plurality of generators configured to supply voltage or current to the memory device; and
   a controller configured to supply a state control signal to the generator system, the state control signal commanding the generators to be in an active state or a standby state, the state control signal reflecting a state of at least one external signal received by the memory device, wherein the controller delays, by at least one microsecond, transitions of the state control signal from the active state to the standby state relative to corresponding state changes of the at least one external signal without substantially delaying transitions of the state control signal from the standby state to the active state relative to corresponding state changes of the at least one external signal.

8. The memory device of claim 7, wherein the controller employs a self-refresh clock signal to delay transitions of the state control signal from the active state to the standby state.

9. The memory device of claim 8, wherein transitions of the state control signal from the active state to the standby state are delayed by at least one-half of a period of the self-refresh clock signal.

10. The memory device of claim 7, wherein the generators commanded by the state control signal are all of the generators in the generator system.

11. The memory device of claim 7, wherein the generators commanded by the state control signal are a subset of the generators in the generator system.

12. A memory device, comprising:
    a generator system comprising a plurality of generators configured to supply voltage or current to the memory device;
    means for supplying a state control signal to the generator system, the state control signal commanding the generators to be in an active state or a standby state; and
    means for generating a self-refresh clock signal having a period suitable to refresh memory cells of the memory device, wherein the means for supplying uses the self-refresh clock signal to delay transitions of the state control signal from the active state to the standby state relative to corresponding state changes of at least one external signal received by the memory device.

13. The memory device of claim 12, wherein the state control signal transitions from the standby state to the active state substantially simultaneously with corresponding state changes of the at least one external signal.

14. A memory device, comprising:
    a generator system comprising a plurality of generators configured to supply voltage or current to the memory device; and means for supplying a state control signal to the generator system, the state control signal commanding the generators to be in an active state or a standby state, the state control signal reflecting a state of at least one external signal received by the memory device, wherein the means for supplying delays, by at least one microsecond, transitions of the state control signal from the active state to the standby state relative to corresponding state changes of the at least one external signal without substantially delaying transitions of the state control signal from the standby state to the active state relative to corresponding state changes of the at least one external signal.

15. The memory device of claim 14, wherein the means for supplying employs a self-refresh clock signal to delay transitions of the state control signal from the active state to the standby state.

16. A method of controlling a state of a generator system in a memory device, the generator system comprising a plurality of generators for supplying voltage or current to the memory device, the method comprising:

receiving at least one external signal whose state is used by the memory device to control whether the generator system is in an active state or a passive state; and generating a state control signal that commands the generators to be in an active state or a standby state in response to the at least one external command, wherein a self-refresh clock of the memory device is used to delay an onset of the standby state of the state control signal relative to a corresponding state change of at least one external signal.

17. The method of claim 16, wherein all of the generators in the generator system are controlled by the state control signal.

18. The method of claim 16, wherein a subset of the generators in the generator system are controlled by the state control signal.

19. The method of claim 16, wherein the state control signal transitions from the standby state to the active state substantially simultaneously with corresponding state changes of the at least one external signal.

20. The method of claim 16, wherein transitions of the state control signal from the active state to the standby state are delayed by at least one-half of a period of the self-refresh clock signal.

21. The method of claim 16, wherein transitions of the state control signal from the active state to the standby state are delayed by at least one microsecond.

22. A method of controlling a state of a generator system in a memory device, the generator system comprising a plurality of generators for supplying voltage or current to the memory device, the method comprising:

receiving at least one external signal whose state is used by the memory device to control whether the generator system is in an active state or a passive state; and generating a state control signal that commands the generators to be in an active state or a standby state in response to the at least one external command, wherein an onset of the standby state of the state control signal is delayed by at least one microsecond relative to a corresponding state change of at least one external signal, and an onset of the active state of the state control signal is not substantially delayed relative to a corresponding state change of the least one external signal.

23. The method of claim 22, wherein transitions of the state control signal from the active state to the standby state are delayed using a self-refresh clock signal.

24. The method of claim 23, wherein transitions of the state control signal from the active state to the standby state are delayed by at least one-half of a period of the self-refresh clock signal.

25. A method of controlling a state of a generator system in a memory device, the generator system comprising a plurality of generators for supplying voltage or current to the memory device, the method comprising:

receiving at least one external signal whose state is used by the memory device to control whether the generator system is in an active state or a passive state;

generating a transition of a first signal from a first state to a second state in response to a corresponding state change of the at least one external signal;

after the transition of the first signal, generating a transition of a second signal from a first state to a second state in response to one of a rising edge and a falling edge of a self-refresh clock signal; and after the transition of the second signal, generating a transition of a third signal from a first state to a second state in response to the other of the rising edge and the falling edge of the self-refresh clock signal, wherein the third signal is supplied to the generator system to control the state of the generators such that an onset of the standby state of the generators is delayed relative to the corresponding state change of the at least one external signal.

* * * * *